United States Patent [19]
Keller

[11] Patent Number: 5,877,619
[45] Date of Patent: Mar. 2, 1999

[54] BATTERY-OPERATED HAND FIELD-STRENGTH METER AND METHOD OF NULL BALANCING SAME

[75] Inventor: Helmut Keller, Eningen u. A., Germany

[73] Assignee: Wandel & Goltermann, Management Holding GmbH, Eningen u. A., Germany

[21] Appl. No.: 720,687

[22] Filed: Oct. 2, 1996

[30] Foreign Application Priority Data

Oct. 4, 1995 [DE] Germany ............ 195 36 948.3

[51] Int. Cl.$^6$ ............................................. G01R 29/08
[52] U.S. Cl. ............................................. 324/76.11; 324/98
[58] Field of Search ............................ 324/98, 76.11

[56] References Cited

U.S. PATENT DOCUMENTS 3,835,380  9/1974  Wobb ........................... 324/72
5,264,798  11/1993  Beg, Jr. et al. ................ 324/98 X Primary Examiner—Thomas P. Noland
Attorney, Agent, or Firm—Michael J. Striker

[57] ABSTRACT

A method of null balancing a hand field-strength meter is described in which the effect of the measurement probe on the balancing is suppressed by short-circuiting the measurement probe by two MOS-FETs connected in series across the probe outputs so that the null balancing can be performed when the field-strength meter is located in the vicinity of a high strength field. In a preferred embodiment of the null balancing circuit for the meter another circuit branch consisting of two other complimentary MOS-FETs connected in series with each other is connected in parallel across the first two MOS-FETs via two resistors R1,R2.

3 Claims, 2 Drawing Sheets

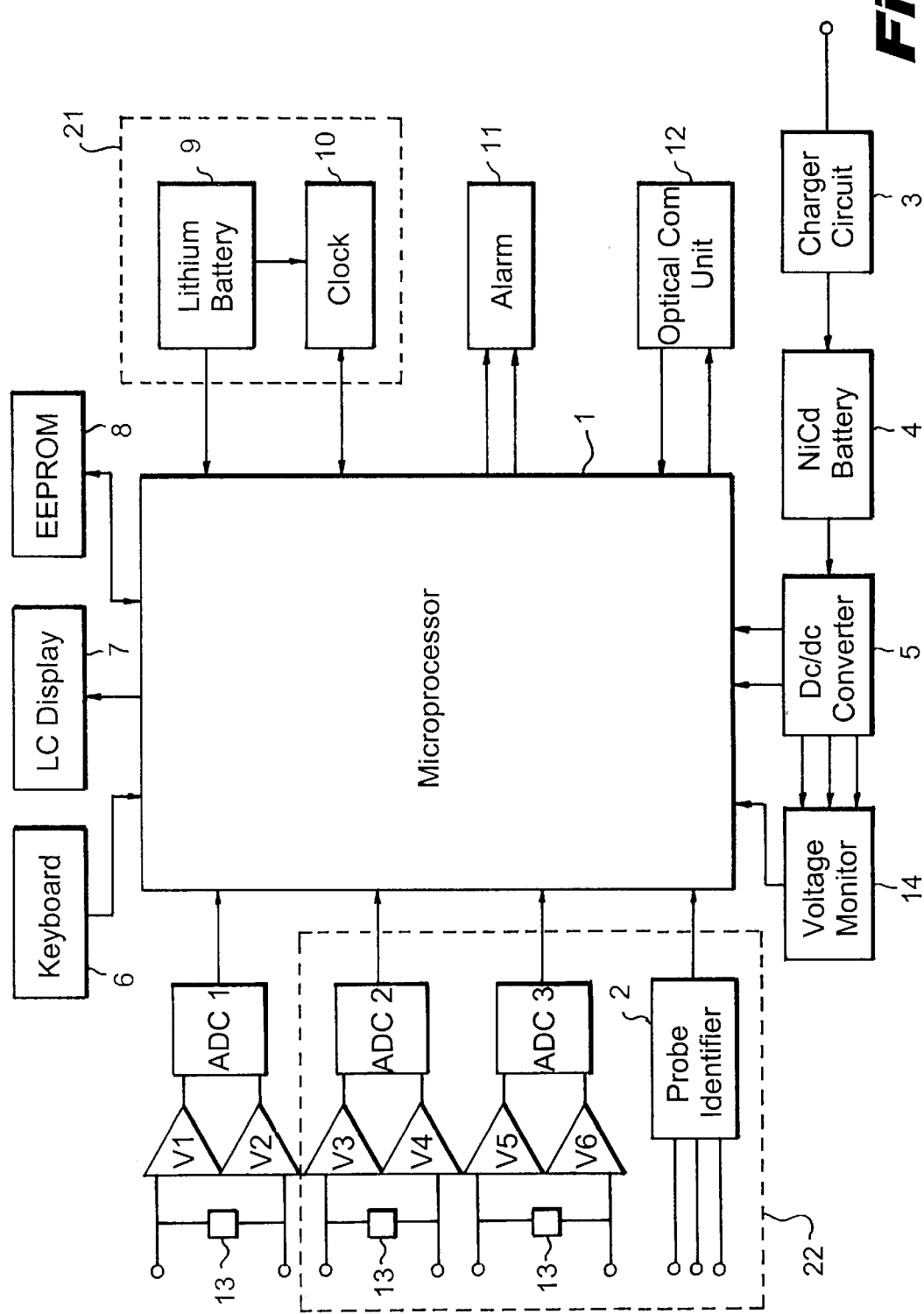

BATTERY-OPERATED HAND FIELD-STRENGTH METER AND METHOD OF NULL BALANCING SAME

BACKGROUND OF THE INVENTION

The present invention relates to a battery-operated hand field-strength meter with at least one measurement probe and a method of null balancing for the hand field-strength meter located in the field to be measured.

Compact, battery-operated hand meters are used for the measurement of high frequency or magnetic fields. A null balance is only possible in the currently known field strength meters, when the meter is not exposed to the expected field strength. To perform a null balance the output d.c. voltage of the input amplifier is measured in this situation and this offset voltage is subtracted from the subsequently measured actual direct voltage values after that. Furthermore of course it is also required that the user try to find a field-free location for null balancing in order to perform the null balance there.

SUMMARY OF THE INVENTION

It is an object of the present invention to provide a battery-operated hand field-strength meter which can be null balanced by a user even when the user is located with the meter in a comparatively strong or intense field.

It is another object of the present invention to provide a method of null balancing the hand field-strength meter according to the invention.

According to the invention the method of null balancing a hand field-strength meter when it is located in a field whose field strength is to be measured, comprises the steps of short-circuiting the measurement probe of the field-strength meter to suppress external signals generated by it by electrically connecting two first MOS-FETs (metal oxide semiconductor-field effect transistor) across the outputs of the measurement probe; connecting two second complimentary MOS-FETs in parallel across the two first MOS-FETs via respective resistors to damp the measurement probe; and controlling the MOS-FETs by at least one control voltage.

The battery-operated hand field-strength meter according to the invention comprises a measurement probe having probe outputs across which a probe voltage appears and including means for producing external signals characteristic of a field strength of a field in which said probe is located; an analysis circuit means for evaluating said external signals from the measurement probe; and null balancing means for suppressing the external signals from the measurement probe. The null balancing means comprises a circuit branch consisting of two complimentary MOS-FETs connected in series to each other which is connected electrically across the probe outputs and two amplifiers connected to respective probe outputs. Each of the MOS-FETs have a source- and bulk-terminal and a gate terminal, the source- and bulk-terminals of the MOS-FETs are connected to each other and to a reference potential so that the probe voltage can be leaked off, while the gate terminal of one MOS-FET is connected to one control voltage and the gate terminal of another MOS-FET is connected to another control voltage. One amplifier is connected electrically to one probe output while the other amplifier is connected electrically to the other probe output. The measurement voltage (result) is read across amplifier outputs of the respective amplifiers.

In a preferred embodiment of the hand field-strength meter a different resistor is connected electrically in series between each output of the measurement probe and each amplifier connected to it and another circuit branch consisting of two other complementary MOS-FETs connected in series with each other is connected in parallel to the first two MOS-FETs via the respective resistors.

In the method of null balancing according to the invention, the field measurement probe voltage is short-circuited by the null balancing circuit in order to suppress the effect of the probe voltage on the balancing when the meter is in an electrical or magnetic field. Because of that, the null balancing determines only the influence of the offset voltage. This type of null balancing might also, because of this reason, be performed by a mechanical switch or relay. However a mechanical switch operated by hand has the disadvantage that balancing is not automatic and it cannot occur under electrical control. Use of a relay which takes a comparatively large amount of space and has a high energy consumption is also disadvantageous for the compact battery-operated meter.

In a particularly preferred embodiment of the method the leakage current for the balancing circuit is maintained under about 1 pA and the effective voltage offset under 10 $\mu$V so that noise is avoided in the null balancing. The null balancing is then advantageously performed by short-circuiting with MOS-FETs. The leakage current of the input amplifier must be under 1 pA. CMOS-operational amplifiers fulfill this requirement. The offset voltage of this type of amplifier is about 1 mV, which is two to three orders of magnitude to large. Its effect is however compensated by the null balancing. A sufficiently small leakage current is maintained through the amplifiers when guard ring engineering techniques or technology is used in the circuit arrangement.

Advantageously the MOS-FETs are controlled by at least one control voltage so that the null balancing can occur automatically, for example, complete in six minutes during which the null balancing operates, when the unit is placed directly at a location having a high field strength.

BRIEF DESCRIPTION OF THE DRAWING

The objects, features and advantages of the invention will now be illustrated in more detail with the aid of the following description of the preferred embodiments, with reference to the accompanying figures in which:

FIG. 2 is a block diagram of an embodiment of the battery-powered hand field-strength meter according to the invention.

DESCRIPTION OF THE PREFERRED EMBODIMENTS

Figure 1:
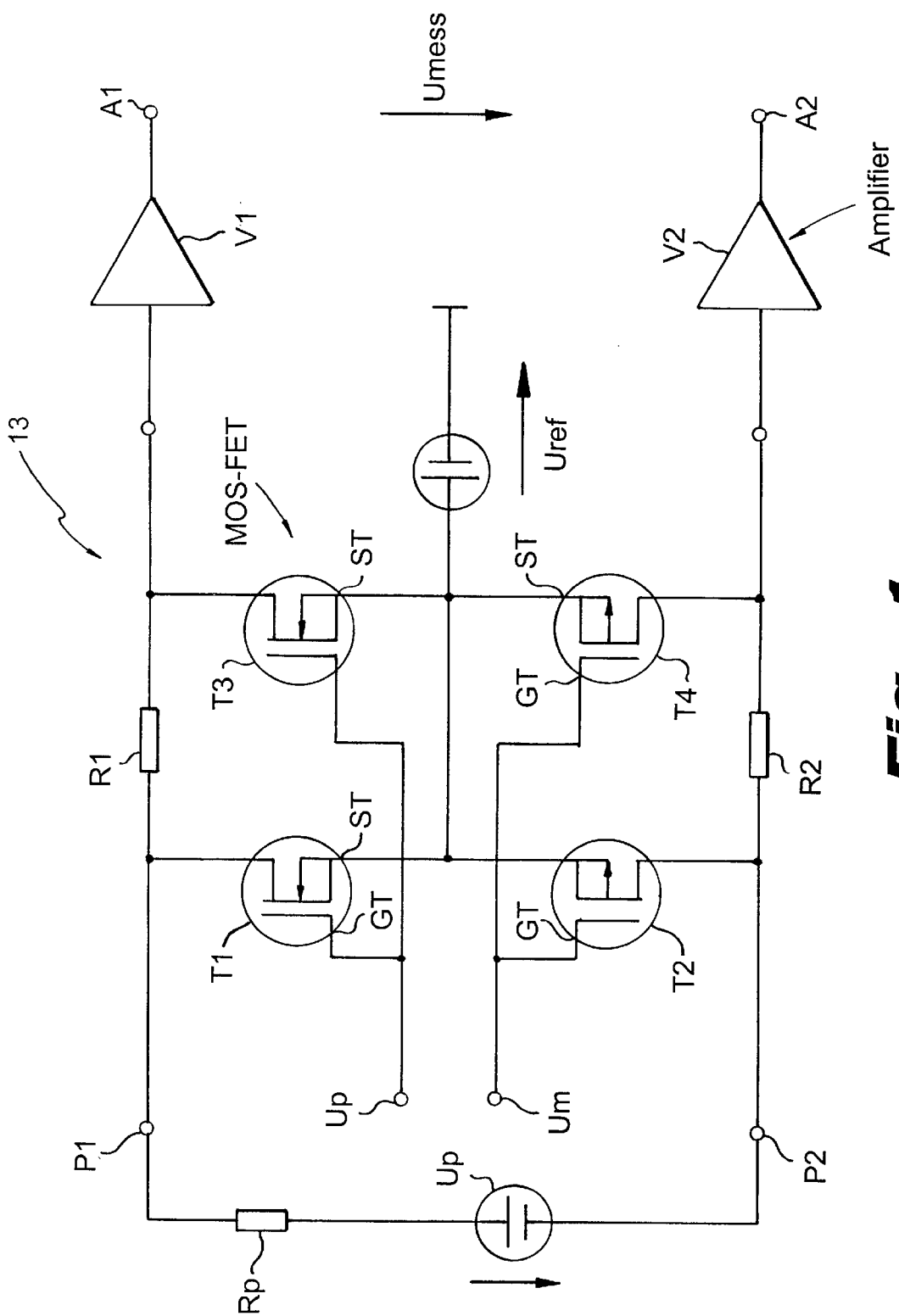
FIG. 1 is a circuit diagram of a null balancing circuit in one embodiment of the battery-powered hand field-strength meter according to the invention.

In a particularly preferred embodiment shown in the drawing the probe voltage is short-circuited by two first MOS-FETs T1,T2 and damped by means of two second MOS-FETs T3,T4 connected in parallel across the first MOS-FETs T1,T2 by resistors R1,R2.

The battery-operated hand field-strength meter according to the invention has a null balancing circuit 13, in which the measurement voltage Up is grounded or leaked off symmetrically at a reference voltage Uref and the measured voltage is read across the outputs A1,A2 of amplifiers V1,V2. The measurement result is thus the probe d.c. voltage Up which is to be determined. The probe voltage Up is direct, i.e. only positive probe voltages occur, and negative probe voltages are prevented. The probe voltage Up is usually leaked off or grounded symmetrically at the reference voltage Uref. Also a positive partial voltage and a negative partial voltage relative to the reference voltage must be evaluated.

Both partial voltages may not be adulterated in an open circuit. The embodiment of the null balancing circuit 13 thus, as shown in FIG. 1, has a circuit branch consisting of two complementary MOS-FETs T1, T2 connected in series which is connected across the probe outputs P1,P2. The MOS-FETs T1,T2 are connected with each other and the reference voltage Uref by connecting their respective bulk- and source-terminals ST. A control voltage Up is applied at the gate terminal GT of the MOS-FET T1 while another control voltage Um is applied at the gate terminal GT of the MOS-FET T2. Since the control of the MOS-FETs occurs by the gate-source voltage, it is sufficient to connect the source of the MOS-FETs to the reference voltage. A leakage current can still flow through the parasitic diodes between the source and the drain in the MOS-FETs. When the bulk terminal is connected with the source terminal ST, the cathode of the parasitic diode is connected with the drain terminal and the anode of the parasitic diode is connected with the source terminal in N-channel MOS-FETs; with P-channel MOS-FETs the arrangement is the reverse. So that the parasitic diodes are always blocked and thus remain currentless, only N-channel MOS-FETs T1, T3 are used for the positive partial voltage and only P-channel MOS-FETs T2, T4 are used for the negative partial voltage.

During the null balancing the circuit 13 must be activated so that the probe voltage Up is suppressed. Since the probe voltage Up can amount to a volt and the mull balancing must be exact to a few microvolts, a damping of the probe voltage by about 120 dB is necessary. According to an additional preferred embodiment the circuit 13 has a resistance R1 connected in series between the probe output P1 and the amplifier V1 and another resistance R2 connected in series between the probe output P2 and the amplifier V2. Another circuit branch consisting of a second pair of complementary MOS-FETs T3,T4 connected in series with each other is connected in parallel to the first circuit branch consisting of the first series connected MOS-FETs T1,T2 via the respective resistors R1,R2. The internal resistance Rp of the probe is in the vicinity of 10 Mohm with E-field probes. In H-field probes it can be lower. The On-resistance (remaining resistance with the circuit activated) of the MOS-FETs is between 10 and 100 ohms. The resulting damping values are smaller than 120 dB. To increase the damping series resistances R1 and R2 following the first short-circuiting devices T1,T2 should be about 100 kohm. A second pair of short-circuiting devices T3,T4 provide the required additional damping.

The embodiment shown in FIG. 1 satisfies all he above-mentioned requirements for a null balancing. The control of transistors T1 to T4 occurs via both control voltages Up and Um. Whether self-conducting or self-blocking MOS-FETs are used, depends on Uref and the available voltage input for Up and Um. The illustrated circuit 13 is designed for a Uref of about 1.25 volts and a control voltage input of −5 v to +5 v. If the circuit is activated, Up must be at +5 v and Um at −5 v. The amplifiers V1 and V2 must have inputs, which have a very small leakage current. CMOS operational amplifiers are perhaps suitable. The amplification factor of the amplifier can also amount to 1 if the subsequent analyzing device is correspondingly sensitive. When Umess is fed to the input of a modern Sigma-Delta converter, the complete dynamic range of the field probe can be determined or detected with V=1 without amplification conversion.

FIG. 2 is a block diagram of one embodiment of the basic hand field-strength apparatus of the invention without the probes. The probes are connected to the operational amplifiers V1 to V6. The components shown in the dashed boxes 21,22 are built-in to the basic apparatus as needed. This apparatus can either be a 1- or 3-channel E- or H-field probe. The analyzer is designed so that isotropic sensitivity properties are obtained, i.e., the measurement result is independent of the incidence direction and polarization of the field to be measured. The microprocessor 1 with EPROM and RAM is shown in the block diagram. The input signal from the probes is fed to the microprocessor 1 via the respective analog/digital converters, ADC1, ADC2, ADC3, after amplification by the respective amplifiers V1, V2; V3, V4; V5, V6. For the case that more than one probe is used, a suitable signal is fed to the microprocessor 1 by the probe identification device 2, also from the probes. The individual components attached to the microprocessor 1 are as follows: charging circuit 3, NiCd battery 4, direct current/direct current voltage converter 5, voltage monitor 14, operator keyboard 6, liquid crystal display 7, EEPROM 8, Li battery 9, real time clock 10, alarm 11 and serial optical communication unit 12. The null balancing circuit including the MOS-FETs shown in FIG. 1 is symbolized in FIG. 2 with the reference number 13.

While the invention has been illustrated and described as embodied in a battery-operated hand field-strength meter and method of null balancing same, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. A battery-operated hand field-strength meter, comprising a measurement probe producing external signals characteristic of a field strength of a field in which the hand field-strength meter is located and whose field strength is to be measured; two first MOS-FETs (T1, T2) connected to the measurement probe for short-circuiting the measurement probe to suppress the external signals; two second MOS-FETs (T3, T4) connected in parallel with said two first MOS-FETs via two resistors (R1, R2) respectively to damp said measurement probe; and means for controlling said MOS-FETs by at least one control voltage.

2. A battery-operated hand field-strength meter as defined in claim 1, wherein said measurement probe has probe outputs (P1, P2) across which a probe voltage (Up) appears and includes means for producing external signals characteristic of a field strength of a field in which said probe is located; and further comprising an analysis circuit means for evaluating said external signals from said measurement probe; and null balancing means (13) for suppressing said external signals from said measurement probe in response to at least one control signal, said null balancing means (13) comprising a circuit branch consisting of said two first MOS-FETs (T1, T2) connected in series to each other, said circuit branch containing said two first MOS-FETs is connected electrically across the probe outputs, each of said two first MOS-FETs have a bulk- and source-terminal (ST) and a gate terminal (GT), said bulk- and source-terminals of said two first MOS-FETs are connected to each other and to a reference potential (Uref), said gate terminal of one (T1) of said two first MOS-FETs is connected to one control voltage (Up) and said gate terminal of another (T2) of said two first MOS-FETs is connected to another control voltage (Um); one amplifier (V1) connected electrically to one (P1) of said probe outputs and having an amplifier output (A1); another amplifier (V2) connected electrically to another (P2) of the probe outputs and having an amplifier output (A2), said measurement voltage (Umess) being read across said amplifier outputs (A1, A2) of said amplifiers (V1, V2); and means for grounding or leaking off the probe voltage symmetrically at the reference voltage (Uref) in response to said at least one control signal, said at least one control signal being provided by at least one of said control voltages (Up, Um).

3. The battery-operated hand field-strength meter as defined in claim 2, wherein said resistors include a resistor (R1) connected electrically in series between said one amplifier (V1) and said one (P1) of said probe outputs and another resistor (R2) connected in series between said amplifier (V2) and said another resistor (R2) of said probe output and another circuit branch consisting of said two second.

* * * * *